United States Patent [19]

Dubetsky et al.

[11] 4,340,436
[45] Jul. 20, 1982

[54] PROCESS FOR FLATTENING GLASS-CERAMIC SUBSTRATES

[75] Inventors: Derry J. Dubetsky, Wappingers Falls; Lester W. Herron, Hopewell Junction; Raj N. Master, Wappingers Falls, all of N.Y.

[73] Assignee: International Business Machines Corporation, Armonk, N.Y.

[21] Appl. No.: 167,975

[22] Filed: Jul. 14, 1980

[51] Int. Cl.³ .................. B32B 31/24; C03B 32/00; C04B 39/00
[52] U.S. Cl. ......................... 156/89; 264/58; 264/61; 264/62; 264/64; 264/65; 264/66; 427/96
[58] Field of Search ............ 156/89; 264/56, 58, 264/60, 61, 62, 65, 66, 241; 427/96, 97, 350, 377; 174/68.5; 361/397, 411; 65/18.4, 32, 33; 29/624, 625, 627, 631

[56] References Cited

U.S. PATENT DOCUMENTS 3,879,509  4/1975  Elderbaum ........................ 264/61
4,234,367  11/1981  Herron et al. ..................... 156/89

OTHER PUBLICATIONS

IBM TDB, vol. 23, No. 5, pp. 1885–1886, Oct. 1980, "Method for Reduction of Shrinkage Distortion in Ceramic Substrates", J. M. Brownlow et al.

*Primary Examiner*—Caleb Weston
*Attorney, Agent, or Firm*—Henry Powers

[57] ABSTRACT

The obtention of enhanced planarity and dimensional integrity of sintered glass-ceramic substrates containing multi-level distribution of conductor patterns (e.g. copper) by a two stage firing of the green sheets, first between the anneal and softening points of crystallizable glass particles, interrupting the firing, superimposing selected light weights on the substrates, and heating through the coalescing temperatures to the crystallization of the glass.

24 Claims, 22 Drawing Figures

PROCESS FOR FLATTENING GLASS-CERAMIC SUBSTRATES

DESCRIPTION

TECHNICAL FIELD

The present invention relates to a method of fabricating a multi-layer glass-ceramic (GC) structure, and more specifically to a method for obtaining improved planarity in a multilayered glass-ceramic structure having a conductor pattern embedded therein to adapt the units as substrate carrier for mounting thereon semiconductor or integrated circuit chips. In particular, the invention relates to a process of producing such substrates starting with certain powders or particles of crystallizable glass and conductor inks or "pastes" containing finely divided particles of a conductive metal, e.g. copper, by the so-called "laminated green sheet" technique, at firing temperatures below the melting point of the conductor metal. The glass-ceramic patterns, in accordance with well established principle, will and can have embedded therein wiring layers, redistribution layers, voltage and ground planes. Also comprehended in the design of the GC substrates are termination surface pads for attaching semiconductor chips, connector leads, capacitors, resistors, covers, etc. Interconnection between buried conductor levels can be achieved through the so-called "vias" formed by conductive metal paste holes in the individual glass-ceramic layers formed prior to lamination which upon firing will become a sintered dense conductive metal interconnection.

One object of this invention is an improved method of forming glass-ceramic substrates.

Another object of this invention is the fabrication of multilayered glass ceramic substrates of improved planarity.

Another object of this invention is to provide an improved method for fabricating planarized multilayered substrates of glass-ceramic containing an internal pattern of conductor elements.

Another object of this invention is the fabrication of planarized multilayered glass-ceramic substrates which are compatible with embedded conductor circuit elements and adaptable for mounting of semiconductor or integrated circuit chips thereon.

Another object of this invention is the fabrication of planarized multilayered glass-ceramic substrate carriers for semiconductor component chips, in which conductor patterns and elements, for electrical attachment of chips, are provided at various levels within the substrate carrier.

BACKGROUND ART

In view of the high packing densities attainable with multilevel ceramic circuit structures, they have achieved extensive acceptance in the electronics industry for packaging of semiconductor integrated devices, and other elements, as for example see U.S. Pat. No. 3,379,943 granted Apr. 23, 1968 to J. G. Breedlove, U.S. Pat. No. 3,502,520 granted Mar. 24, 1970 to B. Schwartz and U.S. Pat. No. 4,080,414 granted Mar. 21, 1978 to L. C. Anderson et al.

In general, such conventional ceramic structures are formed from ceramic green sheets which are prepared from ceramic "paints" by mixing a ceramic particulate, a thermoplastic polymer (e.g. polyvinylbutyral) and solvents. This "paint" is then cast or spread into ceramic sheets or slips from which the solvents are subsequently volatilized to provide a coherent and self-supporting flexible green sheet, which may be finally fired to drive off the resin and sinter the ceramic particulates together into a densified ceramic substrate.

In the fabrication of multilevel structures, an electrical conductor forming composition is deposited (by spraying, dipping, screening, etc.) in patterns on required green sheets which form component layers of the desired multilevel structure. The component sheets may have via or feedthrough holes punched in them, as required for level interconnection in the ultimate structure. The required number of component green sheets are stacked or superimposed to register on each other in the required order. The stack of green sheets is then compressed or compacted at necessary temperatures and pressures to effect a bond between adjacent layers not separated by the electrical conductor forming pattern. Thereafter, the green sheet laminate is fired to drive off the binders and to sinter the ceramic and metal particulates together into a ceramic dielectric structure having the desired pattern of electrical conductors extending internally therein.

Alumina ($Al_2O_3$), because of its excellent insulating properties, thermal conductivity, stability and strength has received wide acceptance as the material of choice for fabrication of such substrates. However, for various high performance application, the relatively high dielectric constant of alumina ($\sim 10$) entails significant signal propagation delays and noise. A further disadvantage of alumina is its relatively high thermal expansion coefficient ($\sim 65$-$70 \times 10^{-7}/°C.$) compared to that of silicon semiconductor chips ($\sim 25$-$30 \times 10^{-7}/°C.$) which may, in certain cases, result in some design and reliability concerns, particularly where a silicon chip is joined to the substrate with solder interconnections.

A particular disadvantage is the high sintering and maturing temperature of commercial alumina ($\sim 1600°$ C.), which restricts the choice of cosinterable conducting metallurgies to refractory metals such as tungsten, molybdenum, platinum, or any combination of these with each other or with certain other metals, which precludes the use of good electrical conductors such as gold, silver, or copper because the latter will be molten before the sintering temperature of alumina is reached.

A multilayer glass-ceramic structure is disclosed in copending application applications Ser. No. 875,703, filed Feb. 6, 1978 by A. H. Kumar et al; and Ser. No. 23,112 filed Mar. 23, 1979 by L. W. Herron et al now U.S. Pat No. 4,234,367, issued Nov. 18, 1980, (whose teachings are incorporated herein by reference thereto), which eliminates disadvantages of alumina ceramic structures. The disclosed multilayer glass-ceramic structures are characterized with low dielectric constants and are compatible with thick film circuitry of gold, silver or copper, and are co-firable therewith.

Of the two types of glass-ceramics disclosed in the aforesaid application Ser. No. 875,703, one has a β-spodumene, $Li_2O.Al_2O_3.4SiO_2$, as the principal crystalline phase while the other has cordierite, $2MgO.2Al_2O_3.5SiO_2$, as the main crystalline phase. A common feature of these sintered glass-ceramics, among others, is their excellent sinterability and crystallization below 1000° C.

The use of copper is relatively new in the thick film technology. Because of copper's oxidizing potential, it is necessary to sinter multilayer structures in reducing or neutral ambients. However, since reducing ambients can occasion adhesion problems, neutral ambients are preferable. A typical industrial cycle to sinter thick copper films on pre-fired alumina substrate would be at a rate of 50°–70° C./min. to a firing or sintering range of 900°–950° C. with a 15 minute hold at the peak temperature followed by cooling at a rate of 50°–70° C./min.

BRIEF DESCRIPTIONS OF THE DRAWINGS

In the accompanying drawings forming a material part of this disclosure:

Figure 5:
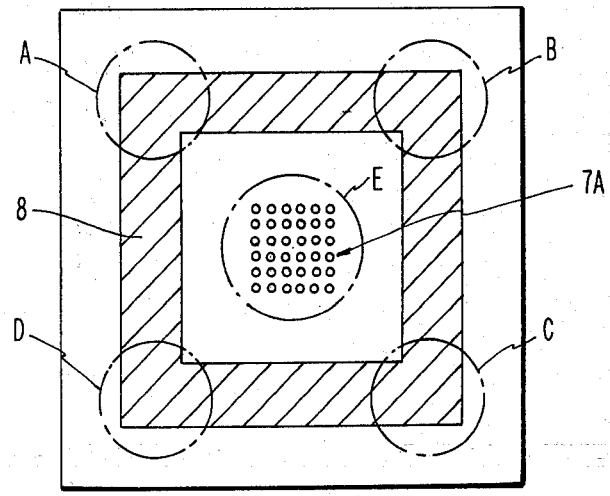
Figure 6A:
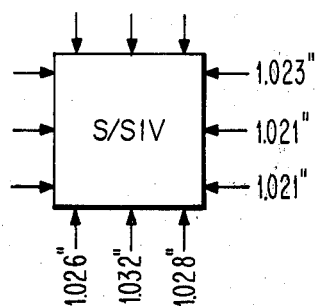
Figure 6B:
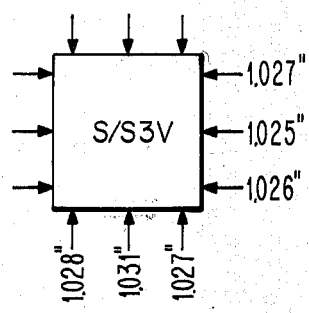
Figure 6C:
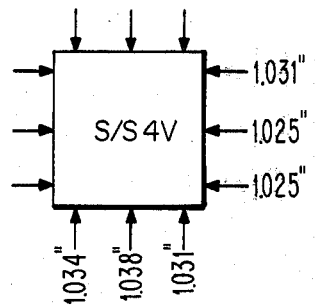
Figure 6D:
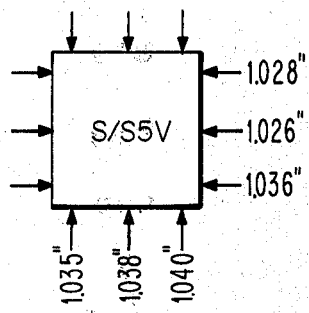
Figure 6E:
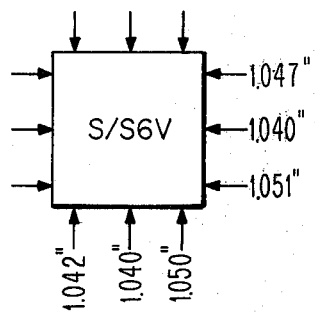
Figure 6F:
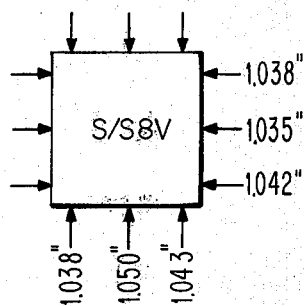
Figure 6G:
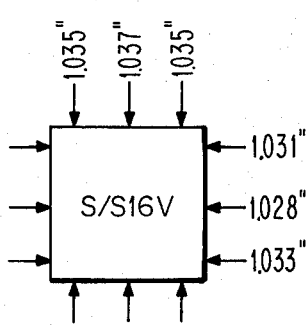

FIG. 5 schematically illustrate the points employed for thickness measurements of substrates fabricated in accordance with this invention.

FIGS. 6A to 6G are schematic representations of lateral dimensional measurements of another group of substrates fabricated in accordance with this invention.

FIGS. 7 to 11 are curves illustrating various characteristics of substrates fabricated for purposes of this invention.

DISCLOSURE OF INVENTION

It was discovered in accordance with this invention that glass-ceramic multilayered substrates of enhanced planarity and dimensional integrity can be fabricated by a modification of the basic concept disclosed in the aforesaid copending application Ser. No. 23,112 (now U.S. Pat. No. 4,234,367). The process involves heating a laminated assembly of green glass-ceramic layers, with an internal conductor (e.g. copper) pattern, in a $H_2O/H_2$ ambient to a burn-out temperature of from about 720°±10° C. to about 785°±10° C. and holding at this temperature for sufficient time (e.g. 3–10 hours) to burn-out the polymeric material and to sinter the glass.

This burn-out temperature is comprehended as between the anneal and softening points of the crystallizable glass employed in the green sheet. Generally the laminated structure can be heated to the burn-out temperature at a rate of 1° to 3° C. per minute. Generally the ambient of hydrogen and water vapor will be in a ratio of $H_2/H_2O$ in the range of about $10^{-4}$ to about $10^{-6.5}$ as discussed in the aforesaid copending application Ser. No. 23,112.

At this point the $H_2/H_2O$ ambient can be substituted with an inert gas, e.g. $N_2$, and further heated, typically about 2° to 4° C. per minute between coalescent and crystallization temperatures of the glass to soften and induce preliminary flow of the glass in the laminate. At this point, prior to reaching the crystallization temperatures, the heating is interrupted or aborted, and the laminates withdrawn from the furnace, and an inert planar light weight, e.g. of alumina ($Al_2O_3$) placed on the substrate. The weight in the form of a platen will at least be coextensive with the substrate to uniformly exert a pressure of about 0.80 to about 4.0 grams per sq. cm. (about 0.012 to about 0.058 lbs. per sq. in.) on the substrate. Normally, interruption of this first stage firing will occur after opportunity for a substantial degree of coalescence between the glass particles of the laminate. Typically the firing can be aborted when the substrates have been heated over about 40 to about 90% of the temperature range between the coalescent and crystallization points of the glass.

After superimpositioning of the platens on the substrates, without lateral constraints, the substrates are returned to the furnace for the second stage firing for completion of the coalescence for complete densification of the substrates, and to the crystallization temperature of the glass for sufficient time to convert the glass into a glass-ceramic structure.

The low weight range of the platens are important for a number of reasons. First, the platens must not exert enough weight to induce lateral extrusion of the coalesing glass particles. Also the weight of the platens must not interfere to any significant degree with uniform shrinkage of the substrates during coalescence and crystallization. In addition, the platen weights should however be sufficiently light to prevent distortion but heavy enough to overcome warpage of the substrates.

Many of the same factors that cause distortion or warpage of a conventional ceramic substrate (e.g. alumina) will also affect the glass-ceramic substrates. Some of these, for example, are non-uniform pressure during lamination or pressing, non-random particle orientation, temperature gradients, and setter tile drag forces during firing, etc. Trying to maintain flatness and distortion control on a multilayer ceramic substrate is complicated by such additional factors as the sintering of the metallic phase within the ceramic which does not sinter at the same temperature or rate as the ceramic and the distribution and loading level of the metallurgy which is not uniform throughout the ceramic. Thus, it is difficult to obtain the desired tolerance on flatness and distortion for a multilayered ceramic substrate.

The complexity of a multilayered ceramic substrate makes it very expensive, since if such a substrate does not meet the dimensional requirements after firing, it is more economical to try to flatten the substrate than it is to discard it. Similarly, even with glass modified multilayered ceramic (90% $Al_2O_3$ + 10% glass) a flattening operation is done on the substrates that do not meet the requirements for flatness. Such substrates are flattened by placing them between two flat surfaces, placing a weight on top, and refiring to a temperature somewhat less than the original sintering temperatures at which point the substrate conforms to the two flat plates as a result of viscous creep under the applied load.

Multilayered substrates of glass-ceramic with embedded conductor pattern (e.g. copper), as contrasted to $Al_2O_3$/glass/molybdenum, also have to meet the same requirements regarding flatness and distortion. As with the $Al_2O_3$/glass multilayered substrates, the same factors that affected flatness and distortion apply to glass-ceramic/copper substrates. However, the glass-ceramics behave in such a manner that flattening by the above conventional processes cannot be used. With the $Al_2O_3$/glass systems the substrate sinters in a continuous fashion by means of liquid enhanced solid state sintering, and thus the creep rate of the material also varies in a continuous fashion. In contrast, the glass-ceramics start out by being completely glass and sinter by viscous flow sintering. With further heating, the glassy substrates crystallize to become mostly crystalline. As this occurs, the viscosity of the material increases rapidly, and thus the creep rate is greatly reduced. In order to flatten a fired glass-ceramic substrate using conventional processes, the substrates would have to be heated to temperatures much higher than the crystallization temperatures. It has been found that cordierite glass-ceramic substrates which crystallize at about 960° C. have shown little or no flattening below 1100° C. Such high temperature cannot be used because copper melts at about 1063° C.

Another concern is Z direction (vertical) shrinkage for glass-ceramic substrates which is only about one half of the X-Y lateral directional shrinkage when fired in a $H_2/H_2O$ ambient required for copper and glass-ceramic sheen sheet.

The invention disclosed herein minimizes the flatness problem as well as optimizing the differential X-Y-Z shrinkage for glass-ceramic/copper substrates. The flattening process described herein for glass-ceramic/copper substrates is applied to the substrates before permanent deformation has occured and temperatures below the melting point of copper. Such glass-ceramic/copper substrates are fired in an $H_2/H_2O$ ambient binder burn-out cycle in the manner described in the aforesaid copending application Ser. No. 23,112 (now U.S. Pat. No. 4,234,367), except that the firing cycle is interrupted at some temperature between the end of the $H_2/H_2O$ burn-out hold (e.g. about 780° C.) and before crystallization begins (about 900° C.), e.g. in the range between the coalescent and crystallization temperatures. After the substrates have cooled in an inert atmosphere (e.g. $N_2$), a flat alumina ($Al_2O_3$) plate or platen, or other suitable inert material, with sufficient but low weight are placed on top of the substrate and the firing continued in an inert atmosphere from its point of interruption. As the firing cycle continues, sintering goes to completion and the camber or distortion, caused by non-uniformity in the distribution of the metallurgy in the substrate, is prevented by the downward force of the flattening plate. With further heating, the flat sintered glassy substrate is crystallized into an undistorted flat substrate. In this process, the Z shrinkage is controlled by the amount of weight on the substrate and the heating rate prior to crystallization. The Z shrinkage can also be controlled by the use of spacers of desired thickness or height between the top and bottom plates (e.g. platen and bottom substrate support) or by varying the applied load on the substrates.

BEST MODE FOR CARRYING OUT THE INVENTION

The process herein described is amenable to a wide variety of glass-ceramic multilayered substrates having embedded therein at varied levels interconnected conductive patterns of copper, gold, silver and the like. For purposes of illustration, the best mode is specifically directed to the utilization of copper based metallurgy for the conductor patterns which can include wiring layers, redistribution layers, voltage and ground planes, termination pads for attaching semiconductor or integrated circuit chips, connector leads, capacitors, resistors, covers, etc.

Illustrative of the glass compositions of the crystallizable glass compositions comprehended in this invention are the formulations disclosed in the aforesaid copending applications Ser. No. 23,112 (now U.S. Pat. No. 4,234,367) and Ser. No. 875,703, as for example the following composition in weight percent.

$SiO_2$—55.00
MgO—20.00
$Al_2O_3$—21.23
$P_2O_5$—2.77
$B_2O_3$—1.00

The multilayered substrate fabrication process involves the following illustrative basic steps:

Step 1

The cullet of the chosen crystallizable glass (specifically the glass composition noted above) is ground to average particle sizes in the range of 2 to 7 micrometers. The grinding can be done in two stages, a preliminary dry or wet grinding to −400 mesh particle size followed by further grinding with suitable organic binders and solvents until the average particle size is reduced to lie between 2 to 7 micrometers and a castable slurry or slip is obtained. A single stage prolonged grinding of cullet in the medium of the binder and solvent, until the desired particle sizes are obtained can also be used. In the latter case, a filtering step may be necessary to remove oversized particles.

By way of example, a suitable binder is polyvinylbutyral resin with a plasticizer such as dipropylglycoldibenzoate (e.g. the commercial Benzoflex plasticizer of the Tennessee Products and Chemical Corp.). Other suitable polymers are polyvinyl formal, polyvinyl chloride, polyvinyl acetate, selected ones of the acrylic resins, and the like. Similarly, other suitable plasticizers such as dioctylphthalate, dibutyl phalate, and the like, can also be used.

The purpose of adding an easily evaporable solvent is (1) to initially dissolve the binder so as to enable it to coat the individual glass particles, and (2) to adjust the rheology of the slip or slurry for good castability. A particularly effective solvent for the purposes of this example are the dual solvent systems of the said U.S. Pat. No. 4,104,345, specifically the dual methanol/-methyl isobutylketone (in a ⅓ weight ratio) solvent system.

Step 2

The slip or slurry prepared as in Step 1 is cast, in accordance with conventional techniques, into this green sheets (e.g. about 200–275 micrometers (8–11 mils thick), preferably by doctor-blading techniques.

Step 3

The cast sheets are blanked to the required dimensions and via holes are punched through them in the required configuration.

Step 4

A metallizing paste of copper is extruded into the via holes in the individual sheets.

For comparative purposes two copper paste formulations were employed for via holes and patterns, one a vendor's (V) copper paste (e.g. Electro-Science Lab #2311R-1) and a proprietory copper paste containing 81% copper, by weight.

Step 5

The copper pastes or inks were then screen-printed onto the individual green sheets of Step 4, in the required conductor patterns.

Step 6

A plurality of sheets (e.g. 10 to 33 in number), prepared as in Step 5, are laminated together in registry in a laminating press;

The temperature and pressure employed for lamination should be such as to cause (1) the individual green sheets to bond to each other to yield a monolithic green substrate, and (2) to cause the green ceramic to sufficiently flow and enclose the conductor patterns.

Figure 1:
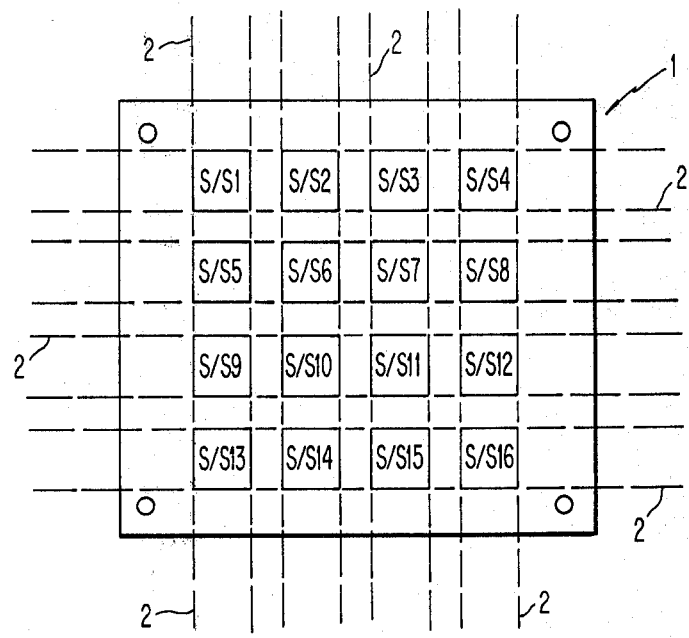
FIG. 1 is an illustrative schematic plane view of a green sheet master laminate which is subdivided into individual substrates.

In accordance with conventional practices the patterns were replicated a plurality of times on a master sheet 1 (FIG. 1) to define a plurality of substrates (s/s 1 ... s/s16) which are separated from the master or mother sheet along cut lines 2, to provide 16 substrates about 7.28×7.28 inches (18.5×18.5 cm) square. As will be understood duplicate mother sheets are employed, one utilizing the proprietary copper pastes and one a vendor copper paste identified by the suffix "V" in association with substrate number, e.g. "s/s 2 V". The absence of the suffix "V" identifies the use of the proprietory copper paste.

Step 7

Firing of the laminate to the sintering temperatures to accomplish binder removal, sintering or coalescence of the glass particles, and conversions to a glass-ceramic by crystallization with concurrent sintering of the metal particles, in the conductor patterns, the dense copper lines and vias.

Figure 2A:
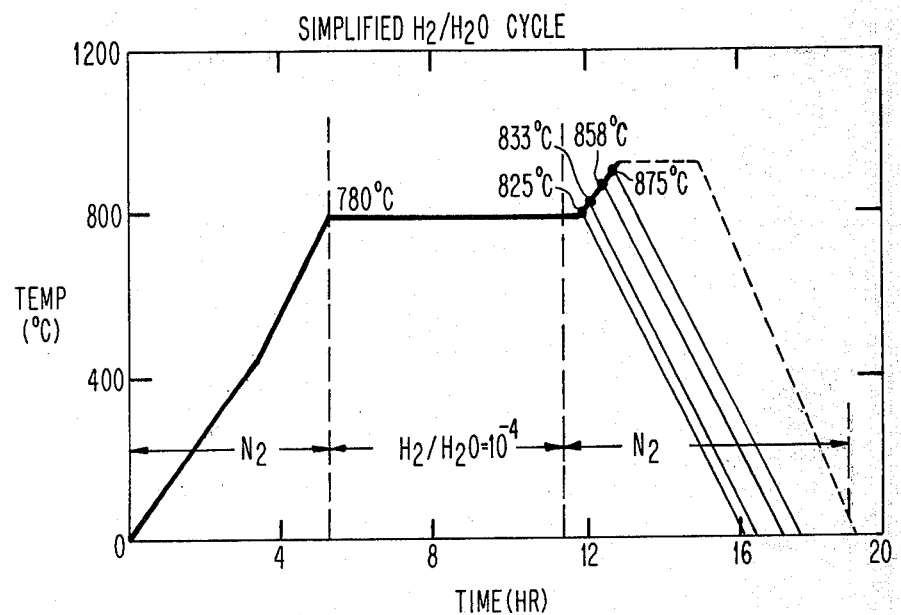
FIGS. 2A and 2B are graphs illustrating, respectively, a first stage and the second stage of a firing cycle in the fabrication of green sheet substrates in accordance with this invention.

A typical firing schedule is shown in FIG. 2A. For this example, the green-laminate is preheated at a rate of 2.0° C./min. in a nitrogen ambient for about 1¼ hours to a temperature of about 200° C. At this point the nitrogen is replaced with a $H_2/H_2O$ ambient in a volume ratio $10^{-4}$. The heating is continued to about 450° C. at which point the rate of heating is increased to about 3.0° C./min., and the heating continued to a hold temperature of about 780° C. (e.g. about 2 hours). After about 6 hours at the 780° C. hold temperature, the $H_2/H_2O$ ambient is switched to a nitrogen ambient, and the 780° C. hold temperature maintained for an additional ½ hour, at which point the heating is again elevated at a rate of 2.0° C./min toward the crystallization temperature of the glass, (e.g. about 960° C. for the glass composition noted, which temperature would be normally held for about 2 hours, after which the temperature is reduced to ambient at a rate of about 3.8° C./min.

However, for purposes of this invention, the heating to the crystallization temperatures were interrupted or aborted for various substrates (s/s) as indicated by the various "fall" lines at 825° C., 833° C., 858° C. and 875° C.

For initial studies the following four substrates were used:

| | | |
|---|---|---|
| s/s 2 | } aborted at 833° C. | |
| s/s 2V | | |
| s/s 7 | } aborted at 850° C. | |
| s/s 7V | | |

Figure 3:
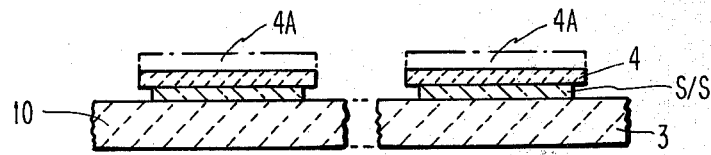
FIG. 3 is a schematic representation of the preparation of substrates for the second stage firing of the substrates.
Figure 4A:
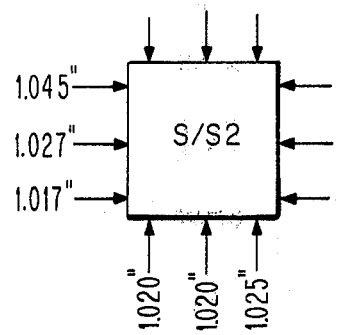
FIGS. 4A to 4D are schematic representations of lateral dimensional measurements of one group of substrates fabricated for purposes of this invention.
Figure 4B:
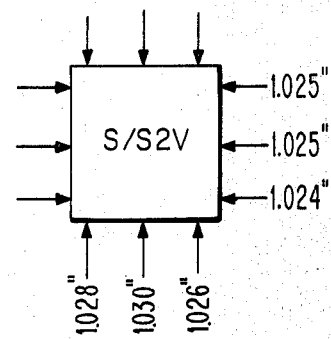
Figure 4C:
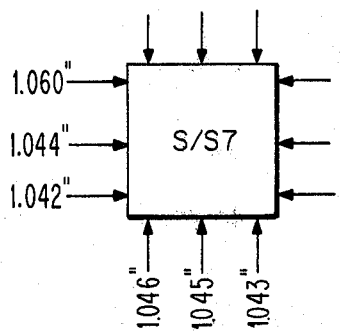
Figure 4D:
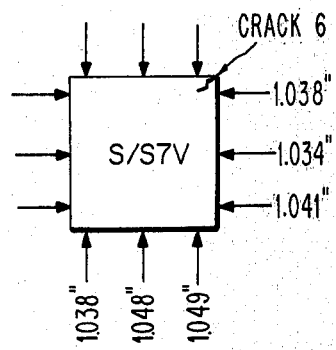

The four substrates s/s were placed on a ¼ inch alumina ($Al_2O_3$) support tile 3 of about 3×3 inches square, and a second like tile 4 weighing 128 grams placed over the substrates to sandwich them therebetween as shown in FIG. 3.

Figure 2B:
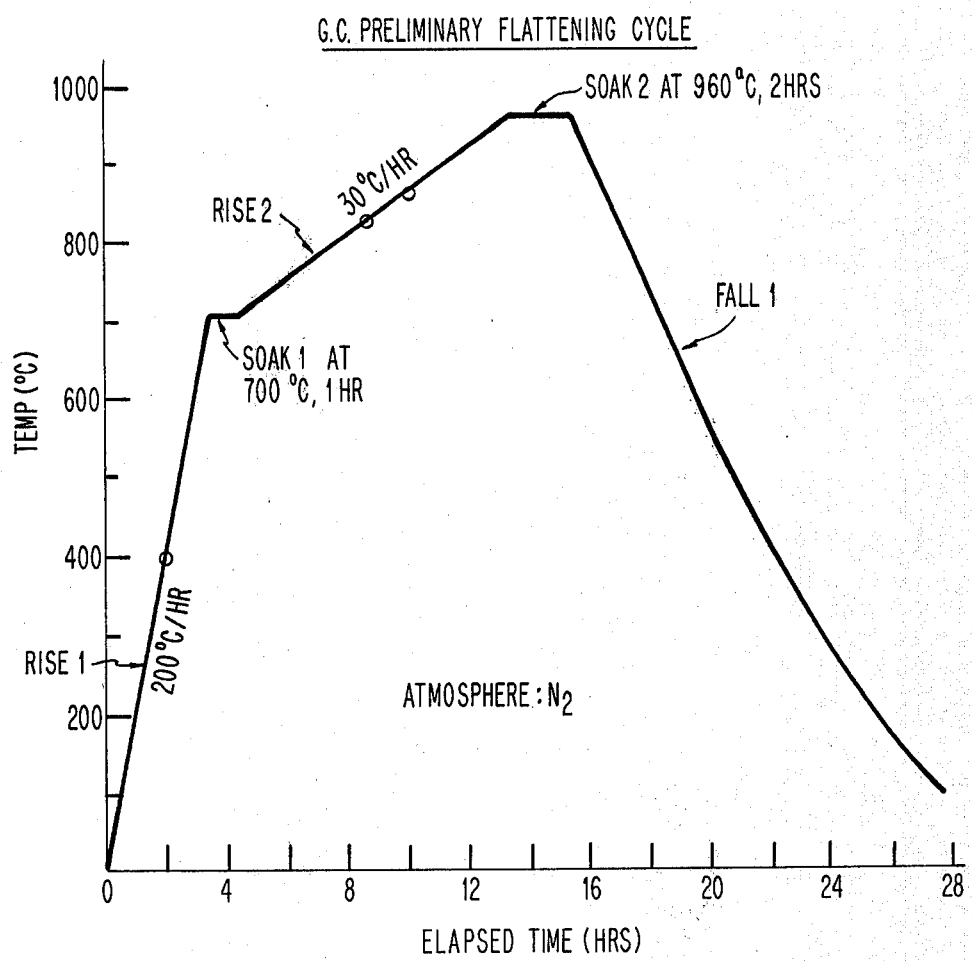

The assembly was then reinserted in the furnace and heated in general accord with the second stage cycle of FIG. 2B as specifically set forth in the following schedule.

Rise 1—200° C./hr. to 700° C.
Soak 1—1.00 hrs at 700° C.
Rise 2—30° C./hr. to 960° C.
Soak 2—2.00 hrs. at 960° C.
Fall 1—200° C. per hour to ~500° C.
Fall 2—natural kiln cooling rate 500° C. to 25° C.

For the first 10 minutes of the second firing cycle (from room temperature) hydrogen was cycled through the oven or kiln, followed by substitution of nitrogen through the remainder of the firing cycle.

These substrates came out very flat but distorted, which is assumed to have been caused by excessive tile weight. The distortion pattern was such that it could be visually seen where the tile weight was greater in some areas than in others. One substrate ss-7 V (FIG. 4D) had a crack 6 in one corner, indicating that it was not free to shrink properly. The flattened results are shown in FIGS. 4A to 4D, wherein the arrows indicate the lines of linear measurement in inches. The percentage shrinkage was calculated as follows:

$$\frac{\text{Initial Size} - \text{Final Size}}{\text{Initial Size}} \times 100$$

Also micrometer measurements of the thickness, in inches, of the areas A, B, C, D and E (FIG. 5) were made, as indicated below

| | Area | | | | |
|---|---|---|---|---|---|
| | A | B | C | D | E |
| s/s-2 | 0.0650 | .0643 | .0652 | .0655 | .0650 |
| s/s-2V | 0.0636 | .0641 | .0641 | .0637 | .0642 |
| s/s-7 | 0.0638 | .0634 | .0634 | .0637 | .0643 |
| s/s-7V | 0.0634 | .0634 | .0642 | .0640 | .0647 |

Additional studies were made to determine optimum top tile weights which will (1) effectively flatten the substrates but (2) will not cause distortion while (3) allowing the substrates to shrink properly.

A series of five substrates, all from a 825° C. abort cycle, one from a 850° C. abort point and one from a 875° C. abort point, were employed, each in this case having the vendor copper paste, were flattened by placement on a 6 inch square alumina bottom or support tile 10; with individual placement of one or more 27 sq. mm. tiles 4 and 4A of 5 gm weight alumina tiles on each substrate to provide the following loads on each substrate.

| S/S | Load, gms | Abort Temp. |
|---|---|---|
| 1V | 5 | 825° C. |
| 3V | 10 | 825° C. |
| 4V | 15 | 825° C. |
| 5V | 20 | 825° C. |
| 8V | 20 | 850° C. |
| 16V | 20 | 875° C. |
| 6V | 25 | 825° C. |

The X-Y linear measurements of the flattened substrates, after firing completion, are shown in FIGS. 6A to 6G.

Figure 8A:
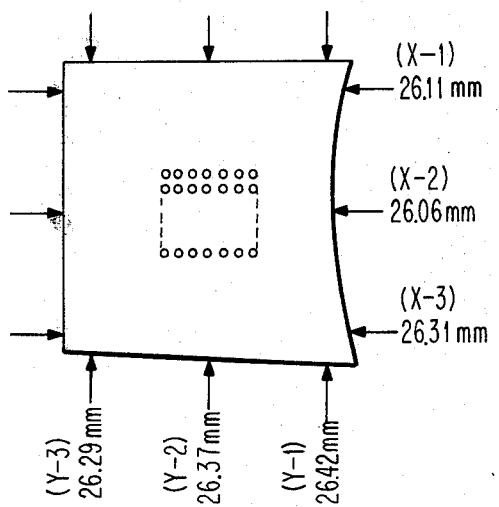

The measurements were employed to determine a "distortion" index as follows, with reference to FIG. 8A;

Max. X deviation + max. Y deviation = distortion.
Specifically with reference to Fig. 8A.

Max. X deviation (26.31 − 26.06) = 0.25
Max. Y deviation (26.42 − 26.29) = 0.13
Distortion = 0.38

Flatness measurements were made on a camber measuring tool, by sliding the substrates on a flat surface having a vertically deflecting anvil which was allowed to contact all areas of the substrate surface. The worst (e.g. greatest deflection of the anvil) reading was employed in the following tabulations:

| S/S | Camber (mils) | Camber (μm) |
|---|---|---|
| 1V | 5 | 125 |
| 3V | 3 | 75 |
| 4V | 2 | 50 |
| 5V | 2 | 50 |
| 6V | 1 | 25 |
| 8V | 5 | 125 |
| 16V | 4 | 100 |

Thickness measurements, in inches, were made at areas A to E as follows:

|  | A | B | C | D | E | % Z |
|---|---|---|---|---|---|---|
| 1V | .0655 | .0653 | .0642 | .0650 | .0649 | 10.96 |
| 3V | .0639 | .0637 | .0638 | .0641 | .0638 | 12.52 |
| 4V | .0635 | .0637 | .0636 | .0634 | .0644 | 12.71 |
| 5V | .0632 | .0627 | .0622 | .0623 | .0629 | 14.16 |
| 6V | .0623 | .0619 | .0619 | .0625 | .0625 | 14.77 |
| 8V | .0646 | .0646 | .0636 | .0642 | .0654 | 11.67 |
| 16V | .0655 | .0646 | .0644 | .0650 | .0653 | 11.01 |

Figure 7:
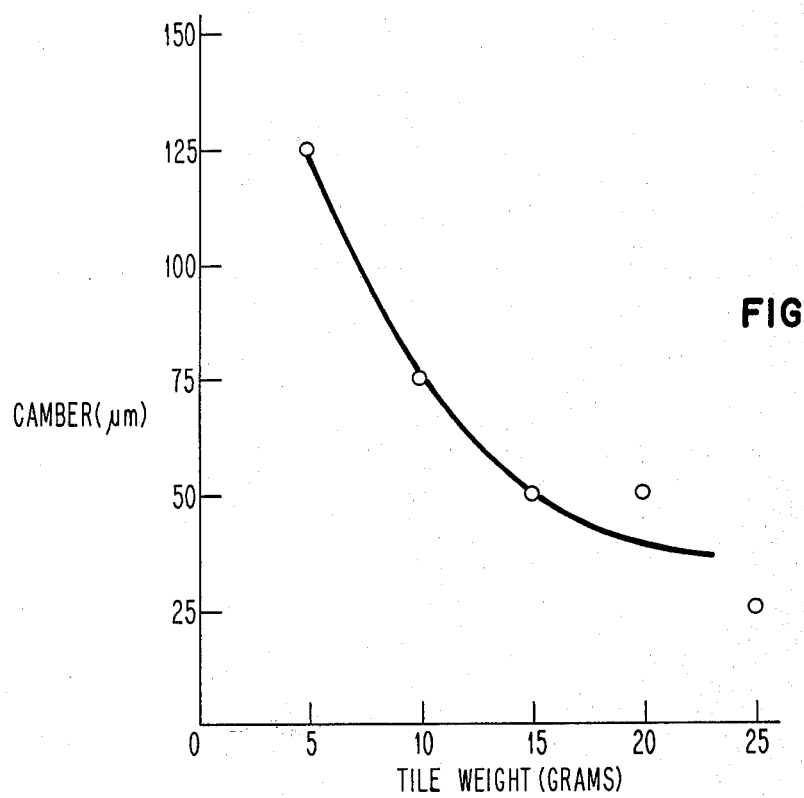

The effects of the flattening tile weights are shown in FIG. 7.

Figure 8B:
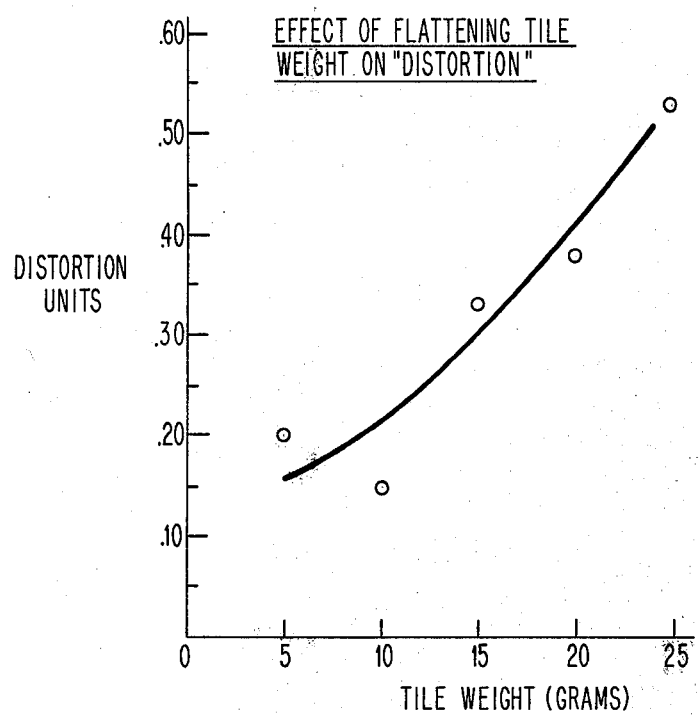

Also, the effects of the tile weights are shown in FIG. 8B.

Figure 9:
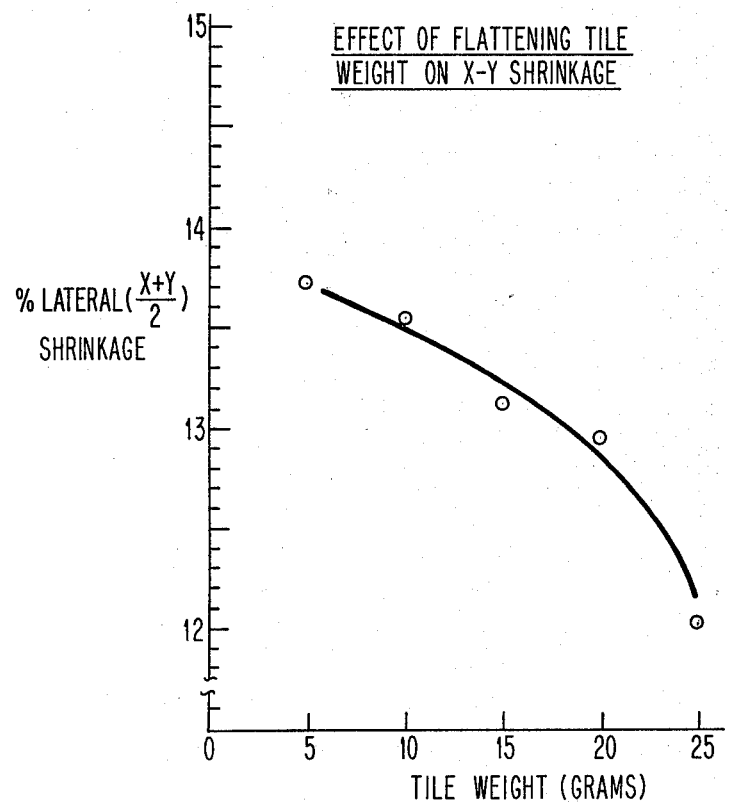

Likewise, the effects of the tile weights are shown in FIG. 9.

Figure 10:
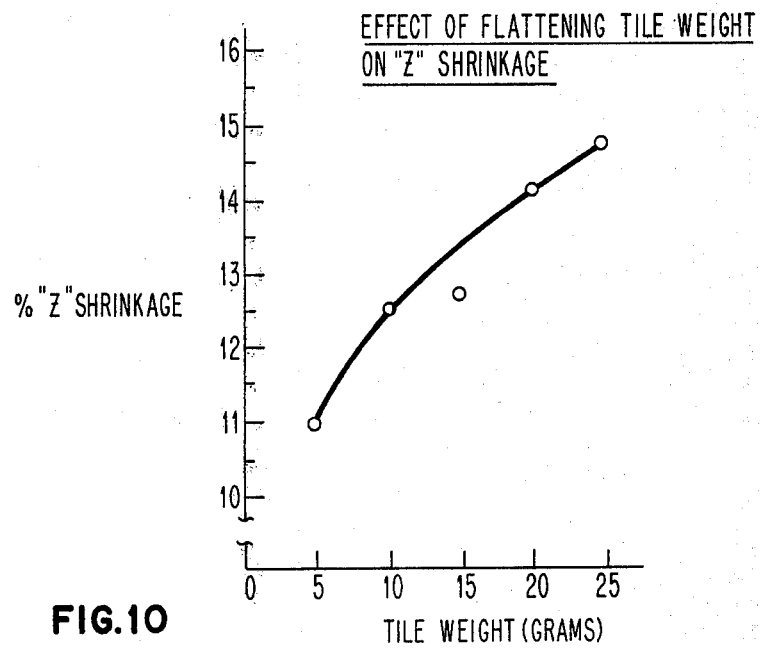
Figure 11:
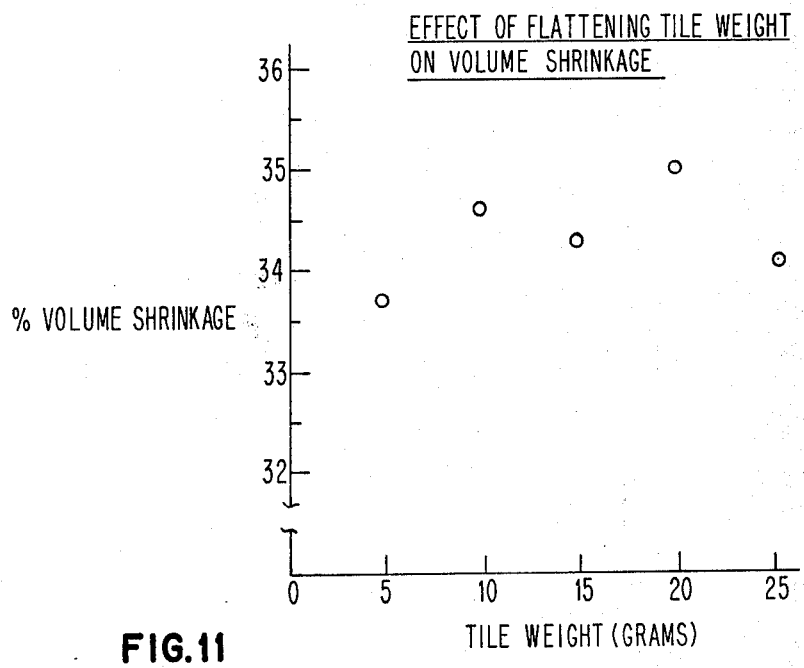

The effects of the tile weights on vertical (Z) shrinkage are shown in FIG. 10, while volume shrinkage effects are shown in FIG. 11.

From the foregoing it is considered that firing of the substrates under pressures of 0.012 to 0.058 lbs/in$^2$ through the coalescent temperatures of the glass to and at the crystallization temperature provide glass-ceramic multilayered substrates of enhanced planarity and lateral dimensional integrity.

While the invention has been illustrated and described with respect to preferred embodiments, it is to be understood that the invention is not to be limited to the precise constructions herein disclosed, and the right is reserved to all changes and modifications coming within the scope of the invention as defined in the appended claims.

Having thus described the invention, what is claimed as new, and desired to be secured by Letters Patent is:

1. A method of forming a glass-ceramic composite structure with a copper based conductor pattern embedded therein comprising:
   A. forming at least one green sheet comprised of a thermoplast organic binder having dispersed therein particles of a crystallizable glass having a crystallizing temperature below the melting point of copper;
   B. forming on a surface of a first said green sheet a pattern of a copper based conductor forming composition;
   C. superimposing a second said green sheet on said surface of said first sheet to sandwich said pattern therebetween;
   D. laminating said sheets together;
   E. heating said laminate in an ambient of hydrogen and $H_2O$ in a ratio of $H_2/H_2O$ in the range of about $10^{-4}$ to about $10^{-6.5}$ to a burn-out temperature in the range between the anneal and softening points of said glass, and maintained thereat for sufficient time to sinter said particles and to decompose and eliminate said binder;
   F. substituting an inert gas for said ambient;
   G. further heating said laminate to a range between the coalescent and crystallization temperatures of said glass to partially coalesce said glass of said laminate;
   H. interrupting the last said heating to superimpose a coextensive inert non-adherent removable light weight planar platen on said laminate, with said platen having a weight in the range below an upper level causing extrusion of said laminate during firing or restricting lateral shrinkage of said laminate and at least at a lower level preventing vertical movement of said laminate during firing;
   I. further heating said laminate and superimposed platen, under sole pressure of said platen, through the coalescing temperatures of said glass to the crystallization temperature thereof to convert said glass into a glass-ceramic structure and;
   J. removing said platen from said glass-ceramic structure.

2. The method of claim 1 wherein the weight of said platen is selected to exert a pressure of about 0.012 lbs/sq.in. (0.8 gms/sq.cm.) to about 0.058 lbs/sq.in. (4.0 gms/sq.cm.) over said laminate.

3. The method of claim 2 including the extension of said pattern to at least one surface of said fired laminate.

4. The method of claim 3 including mounting an integrated semiconductor chip on a said fired laminate surface in electrical connection to a portion of said pattern extension.

5. The method of claim 2 wherein said glass is selected from the group of β-spodumene and alpha-cordierite glasses.

6. The method of claim 5 including the extension of said pattern to at least one surface of said fired laminate.

7. The method of claim 6 including mounting an integrated semiconductor chip on a said fired laminate surface in electrical connection to a portion of said pattern extension.

8. The method of claim 5 wherein said burn-out temperature is in the range of about 720°±10° to about 785°±10° C.

9. The method of claim 8 including the extension of said pattern to at least one surface of said fired laminate.

10. The method of claim 9 including mounting an integrated semiconductor chip on a said fired laminate surface in electrical connection to a portion of said pattern extension.

11. The method of claim 2 wherein said crystallization temperature is in the range of about 920° to about 970° C.

12. The method of claim 11 including the extension of said pattern to at least one surface of said fired laminate.

13. The method of claim 12 including mounting an integrated semiconductor chip on a said fired laminate surface in electrical connection to a portion of said pattern extension.

14. The method of claim 1 including the extension of said pattern to at least one surface of said fired laminate.

15. The method of claim 14 including mounting an integrated semiconductor chip on a said fired laminate surface in electrical connection to a portion of said pattern extension.

16. The method of claim 1 wherein said glass is selected from the group of β-spodumene and alpha-cordierite glasses.

17. The method of claim 16 including the extension of said pattern to at least one surface of said fired laminate.

18. The method of claim 17 including mounting an integrated semiconductor chip on a said fired laminate surface in electrical connection to a portion of said pattern extension.

19. The method of claim 16 wherein said burn-out temperature is in the range of about 720°±10° to about 785°±10° C.

20. The method of claim 19 including the extension of said pattern to at least one surface of said fired laminate.

21. The method of claim 20 including mounting an integrated semiconductor chip on a said fired laminate surface in electrical connection to a portion of said pattern extension.

22. The method of claim 19 wherein said crystallization temperature is in the range of about 920° to about 970° C.

23. The method of claim 22 including the extension of said pattern to at least one surface of said fired laminate.

24. The method of claim 23 including mounting an integrated semiconductor chip on a said fired laminate surface in electrical connection to a portion of said pattern extension.

* * * * *